United States Patent
Vulovic

(10) Patent No.: US 9,297,846 B2
(45) Date of Patent: Mar. 29, 2016

(54) CONTINUOUS BROKEN SENSE LEAD DETECTION SYSTEM

(71) Applicant: Agilent Technologies, Inc., Loveland, CO (US)

(72) Inventor: Marko Vulovic, Columbia, NJ (US)

(73) Assignee: Keysight Technologies, Inc., Santa Rosa, CA (US)

( * ) Notice: Subject to any disclaimer, the term of this patent is extended or adjusted under 35 U.S.C. 154(b) by 135 days.

(21) Appl. No.: 13/691,738

(22) Filed: Dec. 1, 2012

(65) Prior Publication Data

US 2014/0152335 A1   Jun. 5, 2014

(51) Int. Cl.
| | |
|---|---|
| *G01R 31/20* | (2006.01) |
| *G01R 31/02* | (2006.01) |
| G01R 1/06 | (2006.01) |
| G01R 35/00 | (2006.01) |
| G01R 27/14 | (2006.01) |

(52) U.S. Cl.
CPC ............ *G01R 31/026* (2013.01); *G01R 1/06* (2013.01); *G01R 27/14* (2013.01); *G01R 35/00* (2013.01)

(58) Field of Classification Search
None
See application file for complete search history.

(56) References Cited

U.S. PATENT DOCUMENTS

| | | |
|---|---|---|
| 4,038,599 A | 7/1977 | Bove et al. |
| 4,178,543 A | 12/1979 | Wrinn et al. |
| 4,876,515 A | 10/1989 | Ball |
| 5,317,520 A | 5/1994 | Castle |
| 5,886,530 A | 3/1999 | Fasnacht et al. |
| 5,999,002 A * | 12/1999 | Fasnacht et al. ............ 324/525 |
| 6,160,402 A | 12/2000 | Naglich et al. |
| 6,791,344 B2 | 9/2004 | Cook et al. |
| 6,831,469 B2 | 12/2004 | Foreman et al. |
| 6,911,834 B2 | 6/2005 | Mitchell et al. |
| 7,064,564 B2 | 6/2006 | Kister et al. |
| 7,106,070 B2 | 9/2006 | Bertness et al. |
| 7,183,871 B2 | 2/2007 | Sperber et al. |
| 7,245,120 B2 | 7/2007 | Eldridge et al. |
| 2008/0164853 A1* | 7/2008 | Hack et al. .................. 323/205 |
| 2011/0309847 A1 | 12/2011 | Schwartz et al. |

OTHER PUBLICATIONS

Office Action mailed Feb. 28, 2014 in Chinese Patent Application No. 201320685639.9 (Unofficial/non-certified translation provided by foreign agent included).
Office Action Response dated May 14, 2014 in Chinese Patent Application No. 201320685639.9 (Unofficial/noncertified translation provided by foreign agent included).
Notice of Decision to Grant mailed Jun. 19, 2014 in Chinese Patent Application No. 201320685639.9 (Unofficial/noncertified translation provided by foreign agent included).

* cited by examiner

*Primary Examiner* — Minh N Tang

(57) ABSTRACT

Disclosed is a continuous broken sense lead detection system ("CBSLDS") for use with a Kelvin-connected device under test ("DUT"), a power source, and detection system stimulus configured to provide a periodic stimulus voltage. The CBSLDS is configured to detect a discontinuity in a first sense lead, second sense lead, or both, that are in signal communication with the DUT. The CBSLDS includes a first transformer, second transformer, first DC-blocker, second DC-blocker, first detection module, and second detection module.

23 Claims, 4 Drawing Sheets

CONTINUOUS BROKEN SENSE LEAD DETECTION SYSTEM

BACKGROUND OF THE INVENTION

1. Field of the Invention

This invention relates generally to circuit testing systems and more particularly to Kelvin-sensing systems.

2. Related Art

Kelvin connections (also known as "Kelvin sensing," "four-terminal sensing," "four-wire sensing," or "four-point probes") are often used in precision instrumentation applications to eliminate the effects of electrode impedance on measurement fidelity. In general, a Kelvin connection is an electrical impedance measuring technique that utilizes separate pairs of current-carrying and voltage-sensing electrodes to make more accurate measurements than traditional two-terminal sensing techniques.

As an example, if a user wishes to measure the resistance of some component located a significant distance away from an ohmmeter 100 as shown in FIG. 1 this scenario would be problematic because the ohmmeter 100 measures all resistance in the circuit loop 102 which includes the resistance of the wires (i.e., the electrodes from the ohmmeter 100 to the component), $R_{Wire}$ 104 and 106, (also known as the force lead resistance, force lead impedance, electrode impedance, or impedance $R_{Force}$) connecting the ohmmeter 100 to the component being measured, $R_{Subject}$, 108 (also known as the "device under test" or "DUT"). In other words, the resistance measured by the ohmmeter 100 is equal to the combination of the resistances $R_{Wire}$ 104, $R_{Subject}$ 108, and $R_{Wire}$ 106.

In this example, the wire resistance may be very small (only a few ohms per hundreds of feet, depending primarily on the gauge (size) of the wire), but if the connecting wires (also known as the electrodes or force leads) 110 and 112 are very long and/or the component $R_{Subject}$ 108 to be measured has a very low resistance, the measurement error introduced by wire resistance $R_{Wire}$ 104 and $R_{Wire}$ 106 may be substantial.

Similarly, if instead of an ohmmeter 106, a user utilizes a power source (not shown) and voltmeter (not shown) to measure the voltage across ($V_{Measured}$ 114) the combination of the resistances $R_{Wire}$ 104, $R_{Subject}$ 108, and $R_{Wire}$ 106, the measured voltage, $V_{Measured}$ 114, includes the voltage drop across the force lead impedances $R_{Wire}$ 104 and $R_{Wire}$ 106 that result in voltage errors in the measured voltage, $V_{Measured}$ 114.

The Kelvin sensing technique eliminates these problems by utilizing an ammeter and voltmeter with four terminals connected to the DUT. Since resistance is equal to the voltage divided by current, the resistance of the DUT may be determined by measuring the current going through it and the voltage dropped across it. Turning to FIG. 2, a typical known Kelvin connection is shown. In this example, an instrument 200 is shown that includes a power source 202, ammeter 204, and voltmeter (not shown) that measures a measured voltage, $V_{Measured}$ 206, across a DUT 208. The instrument 200 is connected to the DUT 208 via a pair of force leads 210 and 212 (i.e., wires or electrodes) and sense leads (i.e., also wires or electrodes) 214 and 216. The force leads 210 and 212 include force impedance (i.e., wire resistance) values that are shown as $R_{Force}$ 218 and 220. In this example, the signal paths 210 and 212 are referred to as force leads because they are the signal paths along which a forced current 222 will flow from the power source 202 to the DUT 208 and back to the power source 202, where the forced current 222 is produced by the power source 202. The force leads 210 and 212 may also be interchangeably referred to as wires or electrodes. The signal paths 214 and 216 are referred to as sense leads because they are the signal paths that are utilized by voltmeter (not shown) to sense (i.e., measure) the measured voltage across the DUT 208. Similar to the force leads, the sense leads 214 and 216 may also be interchangeably referred to as wires or electrodes.

In an example of operation, the instrument 200 produces the forced current 222 with the power source 202 which is directed to DUT 208. The forced current 222 is the same at all points in the circuit because it is a series loop. Since the measured voltage, $V_{Measured}$ 206, is across the DUT 208, this approach eliminates measuring any voltage drops across the force impedances, $R_{Force}$ 218 and 220, to produce a measured voltage, $V_{Measured}$ 206, without any errors introduced by the force lead impedances, $R_{Force}$ 218 and 220.

Unfortunately, a problem with making measurements with known Kelvin-connected configurations is ensuring that the sense leads are properly connected to the DUT. This is of particular concern in complex automated test systems or systems utilizing fixtures with connectors or pogo pins, which are prone to occasional poor contact. Since the DUT voltage is generally not known, sense lead continuity cannot be reliably inferred from sense lead voltage measurements.

There have been a few known attempts to solve this problem. One approach is to force a DC current into the summing junctions of a differential amplifier that measures the sense lead voltage in a test instrument. Based on a measurement of the resultant voltage developed at the output of the differential amplifier, open sense leads (either or both) may be inferred, where the term "open sense lead" or "open sense lead condition" generally means a broken or discontinuous sense lead. However, this scheme only works when there is no voltage on the DUT, so the power source in the test instrument must be disabled during the detection process. This implies that continuity cannot be continuously verified throughout a test using this approach, but only before it begins or at specific times during the test when the power source is disabled. This approach is utilized by 66300-series of power supplies produced by Agilent Technologies, Inc., of Santa Clara, Calif.

In another approach, a system sends a transformer-coupled square current pulse (generated by a microprocessor upon user request) through each sense and force lead pair and compares the voltage response across each pair of wires to a threshold. However, this approach, similar to that described above, does not allow for continuous detection of an open sense lead condition. Moreover, this approach may be prone to creating observable pulses in a DUT voltage, measured sense voltage (especially when the force leads, sense leads, or both are long), or both. Additionally, this approach may be susceptible to false positive and false negative event detection in the event of coincidental large transient force lead voltages, which are generally caused by rapid changes in the force lead current. This approach is utilized by U.S. Pat. No. 5,886,530, titled "Test Contact Connection Checking Method and Circuit," to Fasnacht et al.

An additional approach is described in U.S. patent application Ser. No. 2011/0309847, titled "High Current Kelvin Connection and Contact Resistance," to Schwartz. In this approach, a system utilizes a center-tapped transformer stimulated by a square-wave voltage source (in a push-pull arrangement) to force currents through a pair of connections to verify continuity. The connections are coupled to the transformer using a switch that is closed when contact resistance measurements are being made. The primary of the transformer is center-tapped and the current through this center tap to common is measured, which allows inference of the contact resistance. As with the approaches described above, this scheme does not allow for detection of an open sense condition during testing, as the system would likely disrupt the test stimulus, measurement, or both.

As such, there is a need in the art for a system that allows for continuous broken sense lead detection in a Kelvin-connected instrument.

SUMMARY

Disclosed is a continuous broken sense lead detection system ("CBSLDS") for use with a Kelvin-connected device under test ("DUT"), a power source, and detection system stimulus configured to provide a periodic stimulus voltage. The CBSLDS is configured to detect a discontinuity in a first sense lead, second sense lead, or both, that are in signal communication with the DUT.

The CBSLDS includes a first transformer, second transformer, first DC-blocker, second DC-blocker, first detection module, and second detection module. The first transformer is in signal communication with the DUT and the detection system stimulus and second transformer is in signal communication with the DUT and the detection system stimulus. The first DC-blocker is in signal communication with the first transformer and the DUT and the second DC-blocker is in signal communication with the second transformer and the DUT. The first detection module is in signal communication with the first transformer and the detection system stimulus and the second transformer is in signal communication with the DUT and the detection system stimulus.

The first detection module is configured to filter a first reflected voltage signal from the first transformer, compare the first reflected voltage signal against a predetermined threshold voltage signal, and determine a discontinuity in the first sense lead in response to comparing the first reflected voltage signal against the predetermined threshold voltage signal. Similarly, the second detection module is configured to filter a second reflected voltage signal from the second transformer, comparing the second reflected voltage signal against the predetermined threshold voltage signal, and determine a discontinuity in the second sense lead in response to comparing the second reflected voltage signal against the predetermined threshold voltage signal.

In an example of operation, the CBSLDS performs a method that includes injecting the periodic stimulus voltage signal into both the first transformer and the second transformer, where the periodic stimulus voltage signal has a stimulus cycle, and receiving the first reflected voltage signal from the first transformer and the second reflected voltage signal from the second transformer. The method further includes comparing both the first reflected voltage signal and the second reflected voltage signal against the predetermined threshold signal. Moreover, the method also includes determining a discontinuity in the first sense lead in response to comparing the first reflected signal against the predetermined threshold voltage signal and determining a discontinuity in the second sense lead in response to comparing the second reflected signal against the predetermined threshold voltage signal.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The invention can be better understood by referring to the following figures. The components in the figures are not necessarily to scale, emphasis instead being placed upon illustrating the principles of the invention. In the figures, like reference numerals designate corresponding parts throughout the different views.

DETAILED DESCRIPTION OF THE INVENTION

Figure 1:
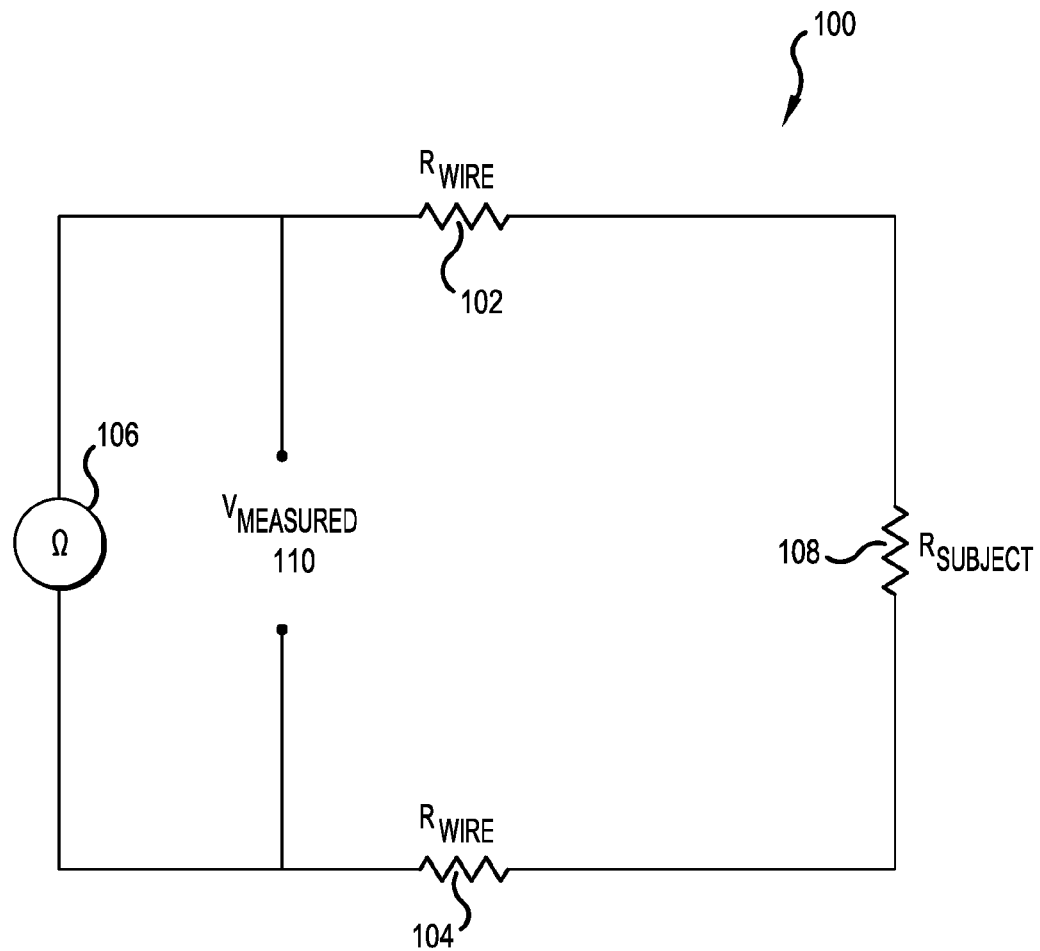
FIG. 1 is a circuit diagram of a known approach for measuring the impedance of a serial circuit utilizing an ohmmeter and two sense leads.
Figure 2:
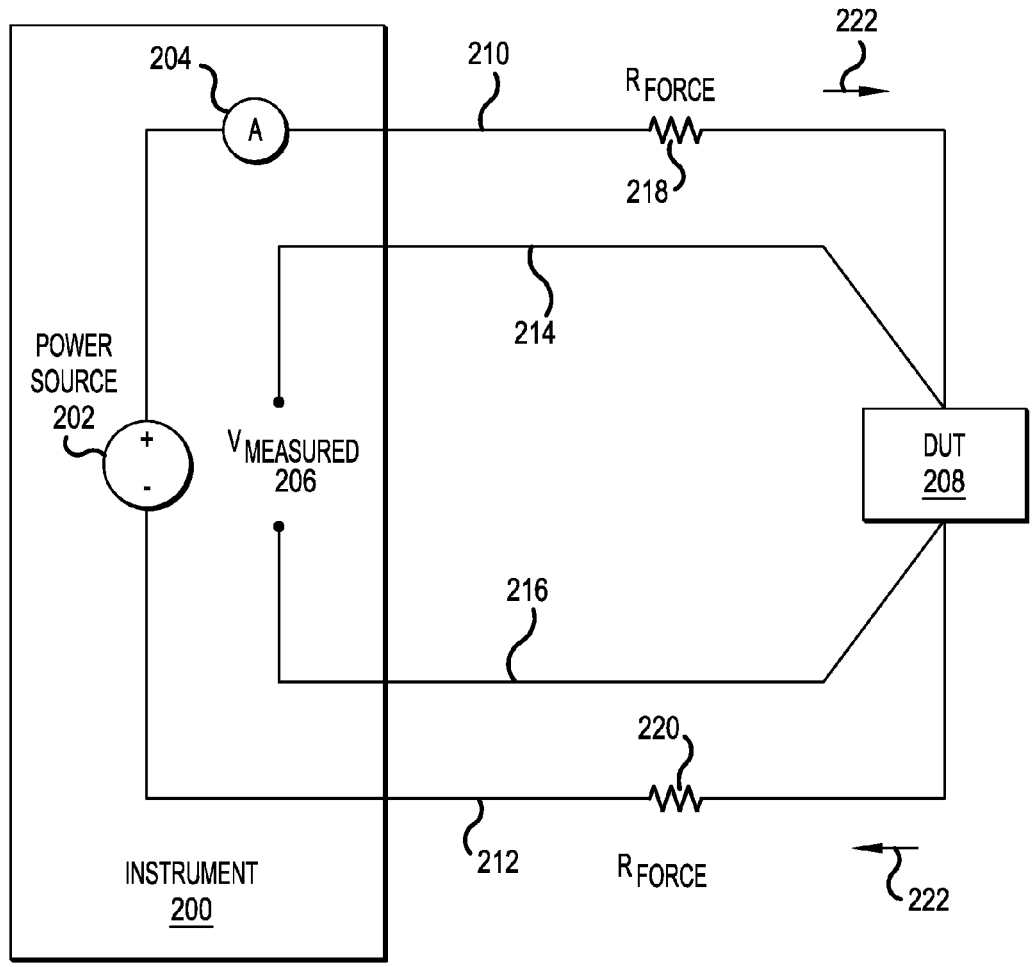
FIG. 2 is a circuit diagram of a known Kelvin-sensing circuit.

In order to solve the problems described in prior art, disclosed is a system that continuously monitors the continuity between each force lead and the corresponding sense lead in a Kelvin-sensing system in signal communication with a device under test ("DUT"). The disclosed system operates without creating any disturbances in the DUT voltage or introducing errors in the measurement. The disclosed system is also resistant to false positive or false negative detection errors.

In order to solve the problems described in prior art, disclosed is a system that continuously monitors the continuity between each force lead and the corresponding sense lead in a Kelvin-sensing system in signal communication with a device under test ("DUT"). The disclosed system operates without creating any disturbances in the DUT voltage or introducing errors in the measurement. The disclosed system is also resistant to false positive or false negative detection errors.

More specifically, disclosed is a continuous broken sense lead detection system ("CBSLDS") for use with a Kelvin-connected DUT, a power source, and detection system stimulus configured to provide a periodic stimulus signal. The CBSLDS is configured to detect a discontinuity in a first sense lead, second sense lead, or both, that are in signal communication with the DUT. The CBSLDS includes a first transformer, second transformer, first DC-blocker, second DC-blocker, first detection module, and second detection module. The first transformer has a first transformer primary winding and first transformer secondary winding and the second transformer has a second transformer primary winding and second transformer secondary winding. The first transformer secondary winding is in signal communication with the DUT and the first transformer primary winding is in signal communication with the detection system stimulus and second transformer secondary winding is in signal communication with the DUT and the second transformer primary winding is in signal communication with the detection system stimulus. The first DC-blocker is in signal communication with the first transformer secondary winding and the DUT and the second DC-blocker is in signal communication with the second transformer secondary winding and the DUT. The first detection module is in signal communication with the first transformer primary winding and the detection system stimulus and the second transformer primary winding is in signal communication with the DUT and the detection system stimulus.

The first detection module is configured to filter a first reflected voltage signal from the first transformer primary winding, compare the first reflected voltage signal against a predetermined threshold voltage signal, and determine a discontinuity in the first sense lead in response to comparing the first reflected voltage signal against the predetermined threshold voltage signal. Similarly, the second detection module is configured to filter a second reflected voltage signal from the second transformer primary winding, comparing the second reflected voltage signal against the predetermined threshold voltage signal, and determine a discontinuity in the second sense lead in response to comparing the second reflected voltage signal against the predetermined threshold voltage signal.

It is appreciated by those skilled in the art that the circuits, components, modules, and/or devices of the CBSLDS are described as being in signal communication with each other, where signal communication refers to any type of communication and/or connection between the circuits, components, modules, and/or devices that allows a circuit, component, module, and/or device to pass and/or receive signals and/or information from another circuit, component, module, and/or device. The communication and/or connection may be along any signal path between the circuits, components, modules, and/or devices that allows signals and/or information to pass from one circuit, component, module, and/or device to another and includes wireless or wired signal paths. The signal paths may be physical such as, for example, conductive wires, electromagnetic wave guides, attached and/or electromagnetic or mechanically coupled terminals, semi-conductive or dielectric materials or devices, or other similar physical connections or couplings. Additionally, signal paths may be non-physical such as free-space (in the case of electromagnetic propagation) or information paths through digital components where communication information is passed from one circuit, component, module, and/or device to another in varying digital formats without passing through a direct electromagnetic connection.

In an example of operation, the CBSLDS performs a method that includes providing the periodic stimulus signal into both the first transformer primary winding and the second transformer primary winding, where the periodic stimulus signal has a stimulus cycle, and receiving the first reflected voltage signal from the first transformer primary winding and the second reflected voltage signal from the second transformer primary winding. The method further includes comparing both the first reflected voltage signal and the second reflected voltage signal against the predetermined threshold signal. Moreover, the method also includes determining a discontinuity in the first sense lead in response to comparing the first reflected signal against the predetermined threshold voltage signal and determining a discontinuity in the second sense lead in response to comparing the first reflected signal against the predetermined threshold voltage signal.

It is appreciated by those skilled in the art that providing the periodic stimulus signal includes either providing a voltage across the first transformer primary winding and second transformer primary winding, which drives a current into both the first transformer primary winding and second transformer primary winding, or injecting a periodic stimulus current signal into via respective injection resistors into the first transformer primary winding and second transformer primary winding.

Figure 3:
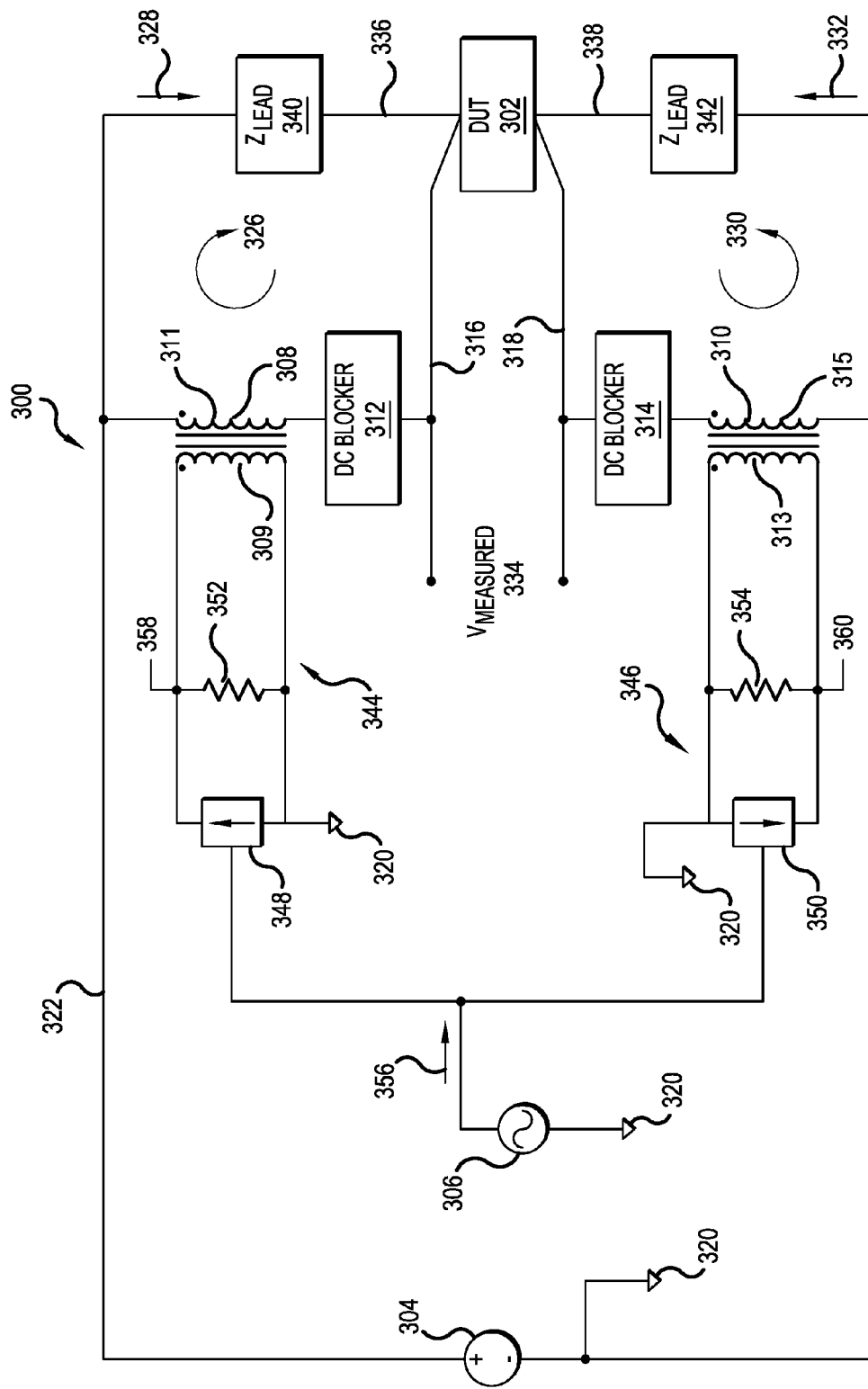
FIG. 3 is a circuit diagram of an example of an implementation of a continuous broken sense lead detection system ("CBSLDS") in signal communication with a DUT, power source, and detection system stimulus in accordance with the invention.

In FIG. 3, a circuit diagram of an example of an implementation of the CBSLDS 300 in signal communication with a DUT 302, power source 304, and detection system stimulus 306 is shown. In this example, the CBSLDS 300 includes a first transformer 308, second transformer 310, first DC-blocker 312, second DC-blocker 314, first sense lead 316, and second sense lead 318. The first transformer 308 includes a first transformer primary winding 309 and first transformer secondary winding 311 and the second transformer 310 includes a second transformer primary winding 313 and second transformer secondary winding 315. The power source 304 is in signal communication with a ground 320, the first transformer secondary winding 311, second transformer secondary winding 315, and the DUT 302 via signal paths 322 and 324, respectively. The power source 304 may be any DC power source including a battery. The detection system stimulus 306 may be any periodic stimulus signal source that may produce a periodic stimulus signal such as, for example, a periodic stimulus voltage signal or periodic stimulus current signal. The periodic stimulus signal may be sinusoidal stimulus signal or other type of periodic stimulus signal. In this example, the periodic stimulus signal source 306 is a periodic stimulus voltage source 306 that is in signal connection to ground 320 and two dependent current sources. The first DC-blocker 312 and second DC-blocker 314 may be may be any DC blocking network capable of blocking any DC current from the first transformer secondary winding 311 and second transformer secondary winding 315. The first DC-blocker 312 and second DC-blocker 314 are in signal communication with the DUT 302 via first sense lead 316 and second sense lead 318, respectively. Examples of the DC-blocker 312 and second DC-blocker 314 may be a capacitor, capacitor network, RLC network that includes an inductor, capacitor, and resistor. The resistor may be a positive temperature coefficient resistor ("PTC" or "PTCR"). Once the type of DC-blocker network is selected, both the first DC-blocker 312 and second DC-blocker 314 must be of the same type. The first transformer secondary windings 311, first DC-blocker 312, and DUT 302 define a first current loop 326 that has a positive force current 328 that flows from the first transformer secondary windings 311 to the DUT 302 and back to the secondary winding of the first transformer 308 via the first sense lead 316 and the first DC-blocker 312. Similarly, the second transformer secondary windings 315, second DC-blocker 314, and DUT 302 define a second current loop 330 that has a negative force current 332 that flows from the secondary winding of the second transformer 310 to the DUT 302 and back to the second transformer secondary windings 315 via the second sense lead 318 and the second DC-blocker 314. In this example, the windings of both the first transformer 308 and second transformer 310 are configured to produce the positive force current 328 and negative force current 332 that are equal but 180 degrees out-of-phase with each other (i.e., of opposite polarity). As a result, there is no resulting stimulus voltage signal appearing across either the DUT 302 or the sense terminals, $V_{Measured}$ 334. In this example, the first transformer 308 and second transformer 310 may be each 1:1 transformers. It is also noted that in this example the first DC-blocker 312 and second DC-blocker 314 are shown connected between the first transformer secondary winding 311 and second transformer secondary winding 315 and the first sense lead 316 and second sense lead 318, respectively. Alternatively, the first DC-blocker 312 and second DC-blocker 314 may be instead connected between the first transformer secondary winding 311 and second transformer secondary winding 315 and the first force lead 322 and second force lead 324.

In this example, the positive sense leads (i.e., first sense lead 316) and negative sense leads (i.e., second sense lead 318), and the positive force lead 336 and negative force lead 338 have commensurate impedances, as is generally the case in practice. The positive force lead 336 has a positive force lead impedance 340 and the negative force lead 338 has a negative force lead impedance 342 that are assumed to be approximately equal.

Additionally, in this example, the detection system stimulus 306 that is configured to provide a periodic stimulus current signal to the first transformer primary windings 309 and second transformer primary windings 313 is shown as including two Norton equivalent circuits 344 and 346 having a first dependent current source 348 and a second dependent current source 350. The first dependent current source 348 and the second dependent current source 350 are a 180 degrees out-of-phase with respect to each other and are in signal communication with ground 320. The Norton equivalent circuits 344 and 346 also include Norton equivalent impedances 352 and 354, respectively. In this example, the detection system stimulus 306 controls both the first dependent current source 348 and the second dependent current source 350 via the periodic stimulus voltage signal 356.

In operation, the first transformer 308 produces a first reflected voltage 358 at the primary windings of the first transformer 308 and the second transformer 310 produces a second reflected voltage 360 at the primary windings of the second transformer 310. The magnitude of the resulting reflected voltages 358 and 360 are directly related to the magnitude of the impedance of the corresponding sense lead and force lead loops 326 and 330, respectively, at the stimulus frequency of the detection system stimulus 306.

The first reflected voltage 358 and second reflected voltage 360 are then passed to a detection system that includes a first detection module (not shown) and second detection module (not shown) along with a stimulus synchronization signal (i.e., periodic stimulus voltage signal 356). The first detection module and second detection module determine whether the first sense lead 316 and second sense lead 318 is in an open condition (i.e., a discontinuity, broken, faulty sense lead or connection), respectively.

In general, the detection system may consist of any number of schemes to determine if the amplitude of the first reflected voltage 358 and second reflected voltage 360 observed implies an 'open' condition for either the first sense lead 316, second sense lead 318, or both. If desired, the detection system could additionally, or alternately, provide a quantitative estimate of the connection resistance. Possible detection schemes include, but are not limited to, a comparator-based design coupled to a detection algorithm that could be as simple as a flip-flop or more complex, depending on the desired level of robustness of the system; a peak measurement-based approach that uses a peak detector circuit to measure the peak of the detection signal (i.e., the first reflected voltage 358 and second reflected voltage 360), which is then compared to a predetermined threshold, if that threshold is exceeded for longer than a predetermined duration, an open sense condition is assumed; or an analog-to-digital ("ADC") based design that digitizes the detection signals (i.e., the first reflected voltage 358 and second reflected voltage 360) directly and processes them with a detection algorithm.

Figure 4:
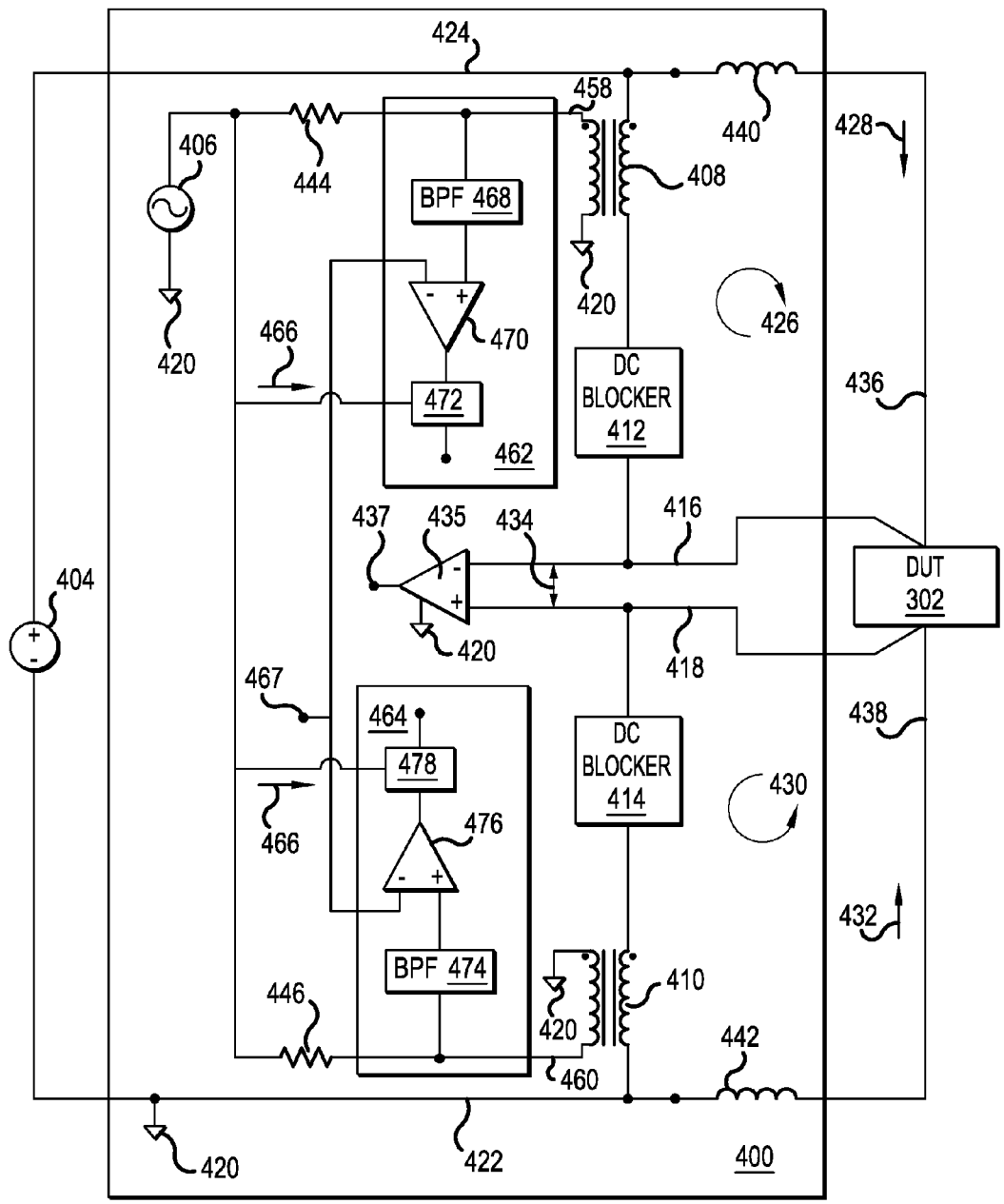
FIG. 4 is a circuit diagram of another example of an implementation of a CBSLDS in signal communication with a DUT, power source, and detection system stimulus in accordance with the invention.

Turning to FIG. 4, a circuit diagram of another example of an implementation of the CBSLDS 400 in signal communication with a DUT 402, power source 404, and detection system stimulus 406 is shown. In this example, the CBSLDS 400 includes a first transformer 408, second transformer 410, first DC-blocker 412, second DC-blocker 414, first sense lead 416, and second sense lead 418. The power source 404 is in signal communication with a ground 420, the first transformer 408, second transformer 410, and the DUT 402 via signal paths 422 and 424, respectively. The power source 404 may be any DC power source including a battery. The detection system stimulus 406 may be any periodic stimulus signal source that may produce a sinusoidal stimulus voltage signal or other type of periodic stimulus voltage signal. The first DC-blocker 412 and second DC-blocker 414 may be may be any DC blocking network capable of blocking any DC current from the first transformer 408 and second transformer 410. The first DC-blocker 412 and second DC-blocker 414 are in signal communication with the DUT 402 via first sense lead 416 and second sense lead 418, respectively. Similar to the description in FIG. 3, examples of the DC-blocker 412 and second DC-blocker 414 may be a capacitor, capacitor network, RLC network that includes an inductor, capacitor, and resistor. The resistor may be a positive temperature coefficient resistor. Once the type of DC-blocker network is selected, both the first DC-blocker 412 and second DC-blocker 414 must be of the same type. The secondary windings of the first transformer 408, first DC-blocker 412, and DUT 402 define a first current loop 426 that has a positive force current 428 that flows from the secondary winding of the first transformer 408 to the DUT 402 and back to the secondary winding of the first transformer 408 via the first sense lead 416 and the first DC-blocker 412. Similarly, the secondary windings of the second transformer 410, second DC-blocker 414, and DUT 402 define a second current loop 430 that has a negative force current 432 that flows from the secondary winding of the second transformer 410 to the DUT 402 and back to the secondary winding of the second transformer 410 via the second sense lead 418 and the second DC-blocker 414. In this example, the windings of both the first transformer 408 and second transformer 410 are configured to produce the positive force current 428 and negative force current 432 that are equal but 180 degrees out-of-phase with each other. As a result, there is no resulting stimulus voltage signal appearing across either the DUT 402 or the sense terminals 434. In this example, the first transformer 408 and second transformer 410 may be each 1:1 transformers.

In this example, the positive sense leads (i.e., first sense lead 416) and negative sense leads (i.e., second sense lead 418), and the positive force lead 436 and negative force lead 438 have commensurate impedances, as is generally the case in practice. The positive force lead 436 has a positive force lead impedance 440 and the negative force lead 438 has a negative force lead impedance 442 that are assumed to be approximately equal. It is appreciated by those skilled in the art that while positive force lead impedance 440 and negative force lead impedance 442 are shown as reactive elements (i.e., inductors) in FIG. 4, they may also include capacitive and/or resistive elements and may alternatively be shown as just impedance elements similar to the ones described in FIG. 3 and described as positive force lead impedance 340 and negative force lead impedance 342, respectively. Additionally, similar to FIG. 3, both positive force lead impedance 440 and negative force lead impedance 442 are lead impedances of the first sense lead 416 and second sense lead 418 so they are not elements of the CBSLDS 400 even though shown within the block describing the CBSLDS 400. They do, however, connect the CBSLDS 400 to the DUT 402.

Additionally, in this example, the detection system stimulus 406 that is configured to provide a periodic stimulus voltage signal to both the primary windings of both first transformer 408 and second transformer 410 is shown having a first current limiting resistor 444 and a second current limiting resistor 446, which may, for example, be equal to 1K ohms each. In this example, the detection system stimulus 406 feeds the second transformer 410 opposite to the way it feeds the first transformer 408 to produce the positive force current 428 and negative force current 432 that are equal but 180 degrees out-of-phase with each other.

In operation, the first transformer 408 produces a first reflected voltage 458 at the primary windings of the first transformer 408 and the second transformer 410 produces a second reflected voltage 460 at the primary windings of the second transformer 410. Again, similar to the description in FIG. 3, the magnitude of the resulting reflected voltages 458 and 460 are directly related to the magnitude of the impedance of the corresponding sense lead and force lead loops 426 and 430, respectively, at the stimulus frequency of the detection system stimulus 406.

The first reflected voltage 458 and second reflected voltage 460 are then passed to a detection system that includes a first detection module 462 and second detection module 464 along with a stimulus synchronization signal 466. The first detection module 460 and second detection module 462 determine whether the first sense lead 416 and second sense lead 418 is in an open condition (i.e., a broken or faulty sense lead or connection), respectively. In this example, the first reflected voltage 458 and second reflected voltage 460 are periodic signals with a frequency corresponding to the detection system stimulus 406 frequency, which may, for example, be 200 kHz.

If the magnitude of the first reflected voltage 458 and second reflected voltage 460 exceeds a predetermined threshold voltage 467, an inference may be made that one or both of the sense leads 416 and 418 are not connected to the DUT 402. In general, the predetermined threshold voltage 467 may be the average of the peak detection voltage observed (i.e., either the first reflected voltage 458 and second reflected voltage 460) with the sense lead 416 or 418 open (i.e., disconnected) and the peak detection voltage observed with the sense lead 416 or 418 connected in the worst-case lead configuration (i.e., the highest impedance in the sense lead force lead loop 426 or 430), as appropriate for the intended application.

In this example, the first detection module 462 may include a first bandpass filter 468, first comparator 470, and first digital processor 472. Similarly, the second detection module 464 may include a second bandpass filter 474, second comparator 476, and second digital processor 478.

In an example of operation, the first detection module 462 receives the first reflected voltage 458 and narrow bandpass filters (centered at the stimulus frequency, for example, of 200 kHz) the first reflected voltage 458 with the first bandpass filter 468 to reject all frequencies other than the stimulus frequency. The resulting filtered first reflected voltage signal is then compared with the predetermined threshold voltage 467 in the first comparator 470. If the filtered first reflected voltage signal is greater than the predetermined threshold 467, the comparator 470 changes state. The output of the first comparator 470 is then passed to the first digital processor 472.

Similarly, the second detection module 464 receives the second reflected voltage 460 and narrow bandpass filters (centered at the stimulus frequency, for example, of 200 kHz) the first reflected voltage 460 with the second bandpass filter 474 to reject all frequencies other than the stimulus frequency. The resulting filtered second reflected voltage signal is then compared with the predetermined threshold voltage 467 in the second comparator 476. If the filtered second reflected voltage signal is greater than the predetermined threshold 467, the comparator 476 changes state. The output of the second comparator 476 is then passed to the second digital processor 478.

Both the first digital processor 472 and second digital processor 478 receive the stimulus synchronization signal 466 from the detection system stimulus 406. Both the first digital processor 472 and the second digital processor 478 are components capable of performing a detection algorithm. The first digital processor 472 may be implemented as a field-programmable gate array ("FPGA"), application specific integrated circuit ("ASIC"), digital signal processor ("DSP"), and microprocessor. Similarly, the second digital processor 478 may be implemented as a FPGA, ASIC, DSP, and microprocessor.

The first digital processor 472 may implement a detection algorithm that examines the resulting comparator 470 pulses, checking for exactly one pulse per stimulus cycle (as delineated by the stimulus synchronization signal 466) for a minimum of N cycles before indicating an open sense connection for the first sense lead 416. In this example, N can be chosen to optimize the tradeoff between a false detection (more likely with smaller values of N) and response speed (slower with larger values of N). As an example, N may be equal to 10. Similarly, the second digital processor 478 may implement the same detection algorithm that examines the resulting comparator 476 pulses, checking for exactly one pulse per stimulus cycle (as delineated by the stimulus synchronization signal 466) for a minimum of N cycles before indicating an open sense connection for the second sense lead 418.

Although the previous description only illustrates particular examples of various implementations, the invention is not limited to the foregoing illustrative examples. A person skilled in the art is aware that the invention as defined by the appended claims can be applied in various further implementations and modifications. In particular, a combination of the various features of the described implementations is possible, as far as these features are not in contradiction with each other. Accordingly, the foregoing description of implementations has been presented for purposes of illustration and description. It is not exhaustive and does not limit the claimed inventions to the precise form disclosed. Modifications and variations are possible in light of the above description or may be acquired from practicing the invention. The claims and their equivalents define the scope of the invention.

What is claimed is:

1. A continuous broken sense lead detection system ("CBSLDS") for use with a Kelvin-connected device under test ("DUT"), a power source, and detection system stimulus configured to provide a periodic stimulus signal, where the CBSLDS is configured to detect a discontinuity in a first sense lead, second sense lead, or both, that are in signal communication with the DUT, the CBSLDS comprising:

a first transformer having a first transformer primary winding and a first transformer secondary winding, wherein the first transformer is in signal communication with the DUT via the first transformer secondary winding and the detection system stimulus via the first transformer primary winding;

a first DC-blocker, wherein the first DC-blocker is in signal communication with the first transformer secondary winding and the DUT;

a first detection module, wherein the first detection module is in signal communication with the first: transformer primary winding and the detection system stimulus, and wherein the first detection module is configured to filter, with a first bandpass filter, a first reflected voltage signal from the first transformer primary winding, compare the bandpass filtered first reflected voltage signal against a predetermined threshold voltage signal, and geneate a first comparator signal in response to comparing the bandpass filtered first reflected voltage signal against the predetermined threshold voltage signal;

a second transformer having a second transformer primary winding and a second transformer secondary winding, wherein the second transformer is in signal communication with the DUT via the second transformer secondary winding and the detection system stimulus via the second transformer primary winding;

a second DC-blocker wherein the second DC-blocker is in signal communication with the second transformer secondary winding and the DUT; and a second detection module, wherein the second detection module is in signal communication with the second transformer primary winding and the detection system stimulus, and wherein the second detection module is configured to filter, with a second band filter, a second reflected voltage signal from the second transformer primary winding, compare the bandpass filtered second reflected voltage signal against the predetermined threshold voltage signal, and generate a second comparator signal in response to comparing the bandpass filtered second reflected voltage signal against the predetermined threshold voltage signal.

2. The CBSLDS of claim 1, wherein the first DC-blocker is configured to block direct current from the first transformer secondary winding to the DUT and the second DC-blocker is Configured to block direct current from the second transformer secondary winding to the DUT.

3. The CBSLDS of claim 2, wherein the first DC-blocker includes a first capacitive element and the second DC-blocker includes a second capacitive element.

4. The CBSLDS of claim 3,
wherein the first DC-blocker is electrically connected between the first transformer secondary winding and the first sense lead, and
wherein the second DC-blocker is electrically connected between the second transformer secondary winding and the second sense lead.

5. The CBSLDS of claim 3,
wherein the first transformer secondary winding is in signal communication with the DUT via a first forced lead,
wherein the first DC-blocker is electrically connected between the first transformer secondary winding and the first forced lead,
wherein the second transformer secondary winding is in signal communication with the DUT via a second forced lead, and
wherein the second DC-blocker is electrically connected between the second transformer secondary winding and the second forced lead.

6. The CBSLDS of claim 3,
wherein the first DC-blocker further includes a first inductive element and first reactive element, and
wherein the second DC-blocker includes a second inductive element and second reactive element.

7. The CBSLDS of claim 2,
wherein the first detection module includes the first bandpass filter, a first comparator, and a first digital processor,
wherein the first bandpass filter is in signal communication with the first transformer primary winding, wherein the first bandpass filter is configured to bandpass filter the first reflected voltage from the first transformer primary winding, and produce the bandpass filtered first reflected signal,
wherein the first comparator is in signal communication with the first bandpass filter, wherein the first comparator is configured to receive the bandpass filtered first reflected signal, receive the predetermined threshold voltage signal, compare the bandpass filtered first reflected signal against the predetermined threshold voltage signal, and generate the first comparator signal,
wherein the first digital processor is configured to receive the first comparator signal, and determine the discontinuity in the first sense lead,
wherein the second detection module includes the second bandpass filter, a second comparator, and a second digital processor,
wherein the second bandpass filter is in signal communication with the second transformer primary winding, wherein the second bandpass filter is configured to bandpass filter the second reflected signal from the second transformer primary winding, and produce a bandpass filtered second reflected signal,
wherein the second comparator is in signal communication with the second bandpass filter, wherein the second comparator is configured to receive the bandpass filtered second reflected signal, receive the predetermined threshold voltage signal, compare the bandpass filtered second reflected signal against the predetermined threshold voltage signal, and generate the second comparator signal, and
wherein the second digital processor is configured to receive the second comparator signal, and determine the discontinuity in the second sense lead.

8. The CBSLDS of claim 7,
wherein the periodic stimulus signal has a stimulus cycle,
wherein the first comparator signal is a pulsed signal having a plurality of pulses,
wherein the first digital processor is configured to determine when one pulse of the first comparator signal exists within one stimulus cycle,
wherein the second comparator signal is a pulsed signal having a plurality of pulses, and
wherein the second digital processor is configured to determine when one pulse of the second comparator signal exists within one stimulus cycle.

9. The CBSLDS of claim 8,
wherein the first digital processor is configured to determine the discontinuity in the first sense lead when the first digital processor has determined that one pulse of the first comparator signal exists within the one stimulus cycle for a predetermined number of stimulus cycles, and
wherein the second digital processor is configured to determine the discontinuity in the second sense lead when the second digital processor has determined that one pulse of the second comparator signal exists within the one stimulus cycle for the predetermined number of stimulus cycles.

10. The CBSLDS of claim 9,
wherein the first digital processor is chosen from the group consisting of a field-programmable gate array ("FPGA"), application specific integrated circuit ("ASIC"), digital signal processor ("DSP"), and microprocessor, and
wherein the second digital processor is chosen from the group consisting, of a FPGA, ASIC, DSP, and microprocessor.

11. The CBSLDS of claim 8, wherein the periodic stimulus signal may he a periodic stimulus voltage signal or periodic stimulus current signal.

12. The CBSIDS of claim 11, wherein the periodic stimulus signal is produced by two separate current sources dependent on the detection system stimulus.

13. The CBSLDS of claim 1, further comprising:
a first processor that receives the first comparator signal and the periodic stimulus signal and determines the discontinuity in the first sense lead based on the received first comparator signal and the periodic stimulus signal; and
a second processor that receives the second comparator signal and the periodic stimulus signal and determines the discontinuity in the second sense lead based on the received second comparator signal and the periodic stimulus signal.

14. A method for detecting a discontinuity in a first sense lead or second sense lead for use with a Kelvin-connected device under test ("DUT"), the method comprising:
injecting a periodic stimulus signal into both a first transformer primary winding and a second transformer primary winding, wherein the periodic stimulus signal has a stimulus cycle, wherein the first transformer secondary winding is in signal communication with the DUT and the second transformer secondary winding is in signal communication with the DUT;
receiving a first reflected voltage signal from the first transformer primary winding and a second reflected voltage signal from the second transformer primary winding;
bandpass filtering the received first and second reflected voltage signal with first and second bandpass filters, respectively;
comparing the bandpass filtered first reflected voltage signal against a predetermined threshold signal;
comparing the bandpass filtered second reflected signal against the predetermined threshold voltage signal;
generating a first comparator signal in response to comparing the bandpass filtered first reflected signal against the predetermined threshold voltage signal; and
generating a second comparing signal in response to comparing the bandpass filtered second reflected signal against the predetermined threshold voltage signal.

15. The method of claim 14, further including blocking direct current from the first transformer secondary winding to the DUT and blocking direct current from the second transformer secondary winding to the DUT.

16. The method of claim 15, wherein;
the first comparator signal is a pulsed signal having a plurality of pulses and the second comparator signal is a signal having a plurality of pulses,
the method further comprising:
determining, with a first processor, the discontinuity in the first sense lead when one pulse of the comparator signal exists within one stimulus cycle, and
determining the discontinuity in the second sense lead when one pulse of the second comparator signal exists within one stimulus cycle.

17. The method of claim 16,
wherein determining the discontinuity in the first sense lead includes determining that one pulse of the comparator signal exists within the one stimulus cycle for a predetermining number of stimulus cycles and
wherein the discontinuity in the second sense lead includes determining that one pulse of the second comparator signal exists within the one stimulus cycle for the predetermined number of stimulus cycles.

18. The method of claim 14, further comprising:
receiving, with a first processor, the first comparator signal and the period stimulus signal;
determining, with the first processor, the discontinuity in the first sense lead based on the received first comparator signal and the periodic stimulus signal;
receiving, with a second processor, the second comparator signal and the periodic stimulus signal and
determining, with the second processor, the discontinuity in the second sense lead based on the received second comparator signal and the periodic stimulus signal.

19. A continuous broken sense lead detection system ("CBSLDS") for use with a Kelvin-connected device under test ("DUI"), a power source, and detection system stimulus configured to provide a periodic stimulus signal, where the CBSLDS is configured to detect a discontinuity m a first sense lead, second sense lead, or both, that are in signal communication with the DUT, the CBSLDS comprising:
a first transformer having a first transformer primary winding and first transformer secondary winding, wherein the first transformer secondary winding is in signal communication with the OUT and the first transformer primary winding is in signal communication with the detection system stimulus;
means for DC-blocking the first transformer secondary winding, wherein the means for DC-blocking the first transformer secondary winding is in signal communication with the first transformer secondary winding and the DUT;
a first detection module, wherein the first detection module is in signal communication with the first transformer primary winding and the detection system stimulus, and wherein the first detection module includes means for bandpass filtering a first reflected voltage signal from the first transformer primary winding, and means for comparing the bandpass filtered first reflected voltage signal against a predetermined threshold voltage signal to generate a first comparison signal;
a second transformer having a second transformer primary winding and second transformer secondary winding, wherein the second transformer secondary winding is in signal communication with the DUT and second transformer primary winding is in signal communication with the detection system stimulus;
means for DC-blocking the second transformer secondary winding, wherein the means for DC-blocking the second transformer secondary winding is in signal communication with the second transformer secondary winding and the DUT; and
a second detection module, wherein the second detection module is in signal communication with the second transformer and the detection system stimulus, and wherein the second detection module includes means for bandpass filtering a second reflected voltage signal from the second transformer primary winding, and means for comparing the bandpass filtered second reflected voltage signal against the predetermined threshold voltage signal to generate a second comparison signal.

20. The CBSLDS of claim 19, wherein the means for DC-blocking the first transformer secondary winding includes blocking direct current from the first transformer secondary winding to the DUT and the means for DC-blocking the second transformer secondary winding includes blocking direct current from the second transformer secondary winding to the DUT.

21. The CBSLDS of claim 20,
wherein the means for DC-blocking the first transformer secondary winding is electrically connected between the first transformer secondary winding and the first sense lead, and wherein the means for DC-blocking the second transformer secondary winding is electrically connected between the second transformer secondary winding and the second sense lead.

22. The CBSLDS of claim 20,
wherein the first transformer is in signal communication with the DUT via a first forced lead,
the means for DC-blocking the first transformer secondary winding is electrically connected between the first transformer secondary winding and the first forced lead,
wherein the second transformer secondary winding is in signal communication with the DUT via a second forced lead, and
wherein the means for DC-blocking the second transformer secondary winding is electrically connected between the second transformer secondary winding and the second forced lead.

23. The CBSLDS of claim 19, further comprising:
a first processing means that receives the first comparison signal and the periodic stimulus signal and determines the discontinuity in the first sense lead based on the received first comparison signal and the periodic stimulus signal: and
a second processing means that receives the second comparison signal and the periodic stimulus signal and determines the discontinuity in the second sense lead based on the received second comparison signal and the periodic stimulus signal.

* * * * *